United States Patent
Chang et al.

(10) Patent No.: US 8,296,634 B2
(45) Date of Patent: Oct. 23, 2012

(54) ERROR CORRECTION DECODER, ERROR CORRECTION VALUE GENERATOR, AND ERROR CORRECTION SYSTEM

(75) Inventors: Yao-Tsu Chang, Dashu Township (TW); Ming-Haw Jing, Dashu Township (TW); Chong-Dao Lee, Dashu Township (TW); Jian-Hong Chen, Dashu Township (TW); Zih-Heng Chen, Dashu Township (TW)

(73) Assignee: I Shou University, Kaohsiung County (TW)

(*) Notice: Subject to any disclaimer, the term of this patent is extended or adjusted under 35 U.S.C. 154(b) by 448 days.

(21) Appl. No.: 12/714,467

(22) Filed: Feb. 27, 2010

(65) Prior Publication Data
US 2011/0214031 A1 Sep. 1, 2011

(51) Int. Cl.
*H03M 13/00* (2006.01)
*H03M 13/03* (2006.01)

(52) U.S. Cl. ......... 714/781; 714/746; 714/755; 714/793

(58) Field of Classification Search .................. 714/755, 714/746, 781, 793
See application file for complete search history.

(56) References Cited

U.S. PATENT DOCUMENTS

| | | | |
|---|---|---|---|
| 6,374,383 B1* | 4/2002 | Weng | 714/781 |
| 6,446,234 B1* | 9/2002 | Cox et al. | 714/758 |
| 6,539,516 B2* | 3/2003 | Cameron | 714/785 |
| 6,643,819 B1* | 11/2003 | Weng | 714/785 |
| 6,684,364 B2* | 1/2004 | Cameron | 714/785 |
| 7,080,310 B2* | 7/2006 | Cameron | 714/785 |
| 7,353,449 B2* | 4/2008 | Muller et al. | 714/785 |

* cited by examiner

Primary Examiner — John J Tabone, Jr.
(74) Attorney, Agent, or Firm — Foley & Lardner LLP

(57) ABSTRACT

An error correction decoder includes a syndrome generator and an error correction value generator. The syndrome generator is operable to generate a plurality of syndromes based upon a received signal generated according to a generator polynomial. The error correction value generator is operable to generate a plurality of product values. Each of the product values is generated for one of the syndromes based upon a respective power of the roots of the generator polynomial. The respective power is determined based upon a respective index corresponding to one of the syndromes to be considered and unit positions of the received signal. The error correction value generator is further operable to generate an error correction value according to the product values, and to provide an error correcting device coupled thereto with the error correction value for correcting an error of the received signal.

24 Claims, 4 Drawing Sheets

ERROR CORRECTION DECODER, ERROR CORRECTION VALUE GENERATOR, AND ERROR CORRECTION SYSTEM

BACKGROUND OF THE INVENTION

1. Field of the Invention

The present invention relates to an error correction decoder, more particularly to an error correction decoder for cyclic codes.

2. Description of the Related Art

Nowadays, development of digital storage technology and communication technology has resulted in relatively high speed of data access and transmission. However, since transmission media and channels are easily corrupted by interference during data access and transmission, error detection and correction has become more and more significant. Generally, error-correcting codes are used in existing satellite communication systems, digital televisions, various digital audio-video storage media, and the like for enhancing reliability of data access and transmission. In the error-correcting codes, application of a cyclic code is not uncommon.

A conventional error correcting method includes the steps of: receiving a signal; determining a plurality of syndromes based upon the received signal; using Berlekamp-Massey Algorithm to determine an error locator polynomial and an error magnitude polynomial based upon the syndromes; performing Chien search with the error locator polynomial and the error magnitude polynomial to determine at least one error position and an error correction value corresponding to the error position; and performing error correction upon the received signal. Theoretical bases of the conventional error correcting method are described in "*The Art of Error Correcting*, Robert H. et al., 2006" and "*Fundamentals of Error-Correcting Codes*, W. Cary Huffman and Vera Pless, 2003."

However, the conventional error correcting method takes relatively more time and is more complex since it involves complex calculation for obtaining the error locator polynomial and the error magnitude polynomial and Chien search. The conventional error correcting method would not result insignificant problems or time delay in the past since the rate of data access and transmission then are relatively low. However, since performance and transmission rate of current computer systems are greatly enhanced, a large number of circuits and an increased speed for processing data are currently required to complete decoding procedure within a desired time limit. Unfortunately, the cost of hardware will increase, and consumed power of the systems will rise.

SUMMARY OF THE INVENTION

Therefore, an object of the present invention is to provide an error correction decoder capable of alleviating the above drawbacks of the prior art.

Accordingly, an error correction decoder of this invention is adapted to be coupled to an error correcting device for providing the error correcting device with an error correction value to correct an error corresponding to an error position of a received signal received thereby. The received signal is generated based upon a generator polynomial. The error correction decoder comprises a syndrome generator and an error correction value generator.

The syndrome generator is adapted to receive the received signal, and is operable to generate a plurality of syndromes based upon the received signal. Each of the syndromes is associated with a respective index.

The error correction value generator is coupled to the syndrome generator, and is adapted to receive the syndromes therefrom. The error correction value generator includes a first computing module and a second computing module coupled to the first computing module.

The first computing module is operable to generate a plurality of product values, each of which is generated for one of the syndromes based upon a respective power of roots of the generator polynomial. The respective power is determined based upon the respective index corresponding to one of the syndromes to be considered and unit positions of the received signal. The second computing module is operable to generate the error correction value according to the product values obtained by the first computing module, and to provide the error correcting device with the error correction value computed thereby for correcting the error of the received signal.

Another object of the present invention is to provide an error correction value generator adapted for use in the above-mentioned error correction decoder according to the present invention.

According to another aspect of this invention, an error correction system is adapted for correcting an error corresponding to an error position of a received signal received thereby. The error correction system comprises the above-mentioned error correction decoder and an error correcting device. The error correcting device is coupled to the error correction value generator of the error correction decoder, and is adapted to receive the error correction values therefrom. The error correcting device is operable to correct the error of the received signal according to the error correction values.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
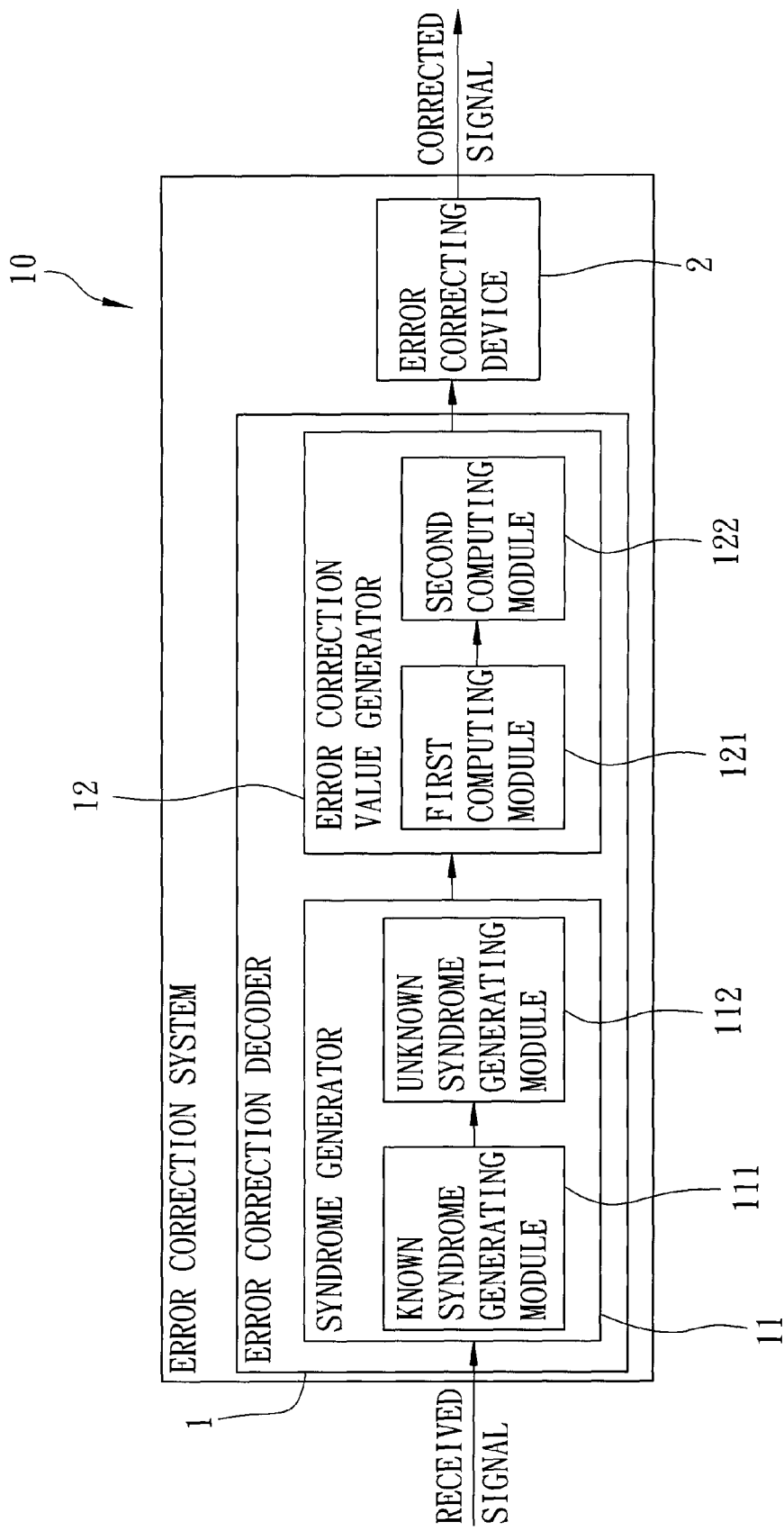
FIG. 1 is a block diagram illustrating a preferred embodiment of an error correction decoder used in an error correction system according to the present invention.

Referring to FIG. 1, a preferred embodiment of an error correction system 10 according to this invention includes an error correction decoder 1 and an error correcting device 2 coupled to the error correction decoder 1. A source signal is encoded based upon a generator polynomial to generate a cyclic codeword with a length n. Then, the cyclic codeword is transmitted to the error correction system 10 via a transmission channel to result in a received signal received by the error correction system 10.

Since the cyclic codeword may be corrupted by interference during transmission through the transmission channel, the received signal would not be exactly the same as the source signal. The cyclic codeword can be expressed as a codeword polynomial $$c(x) = \sum_{j=0}^{n-1} c_j x^j,$$

where j is unit positions of the received signal and $(c_0, c_1, \ldots, c_{n-1})$ denotes an associated code vector. Errors of the received signal attributed to the interference can be expressed as an error polynomial $$e(x) = \sum_{j=0}^{n-1} e_j x^j,$$

where $e_j$ is the jth error correction value. Therefore, the received signal can be expressed as $$r(x) = \sum_{j=0}^{n-1} r_j x^j = c(x) + e(x). \quad (1)$$

The error correction decoder 1 includes a syndrome generator 11 and an error correction value generator 12 coupled to the syndrome generator 11, and is operable to provide the error correcting device 2 with the error correction values $e_j$. According to the error correction values $e_j$, the error correcting device 2 is operable to correct the errors of the received signal to output a corrected signal corresponding to the cyclic codeword of the source signal. Embodiments and operation of the error correction decoder 1 and the error correcting device 2 are described in the following.

First, the syndrome generator 11 receives the received signal, and is operable to generate a plurality of syndromes $S_i$, each of which is associated with a respective index i. The syndromes include at least one known syndrome and at least one unknown syndrome. The syndrome generator 11 includes a known syndrome generating module 111, and an unknown syndrome generating module 112 coupled to the known syndrome generating module 111. The known syndrome generating module 111 is operable to generate the known syndrome based upon the roots $\beta^i$ of the generator polynomial and the polynomial $r(x)$ of Equation (1). The unknown syndrome generating module 112 is operable to generate the unknown syndrome according to the known syndrome. Since methods for generating the syndromes $S_i$ are known to those skilled in the art (see, for example, "Algebraic Decoding of (71, 36, 11), (79, 40, 15) and (97, 49, 15) Quadratic Residue Codes," *IEEE Transactions on Communications*, Vol. 51, No. 9, pages 1463-1473, September 2003, and "Algebraic Decoding of (103, 52, 19) and (113, 57, 15) Quadratic Residue Codes," *IEEE Transactions on Communications*, Vol. 53, No. 5, pages 749-754, May 2005), details thereof will be omitted herein for the sake of brevity.

Then, the error correction value generator 12, which includes a first computing module 121 and a second computing module 122, receives the syndromes $S_i$ generated by the syndrome generator 11. For each of the unit positions j of the received signal, the first computing module 121 is operable to generate a group of product values that are defined as $S_i/\beta^{j\cdot i}$. The second computing module 122 is coupled to the first computing module 121, and is operable to generate the error correction values $e_j$ according to the groups of the product values $S_i/\beta^{j\cdot i}$, respectively.

Figure 2A:
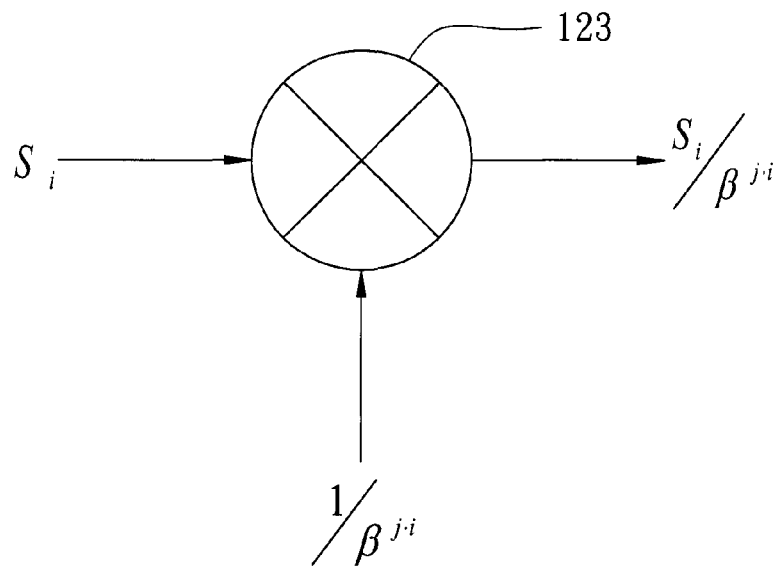
FIGS. 2A and 2B are schematic diagrams illustrating a first preferred embodiment of an error correction value generator of the error correction decoder, which includes a first computing module containing a multiplier as shown in FIG. 2A and a second computing module containing an adder as shown in FIG. 2B.
Figure 2B:
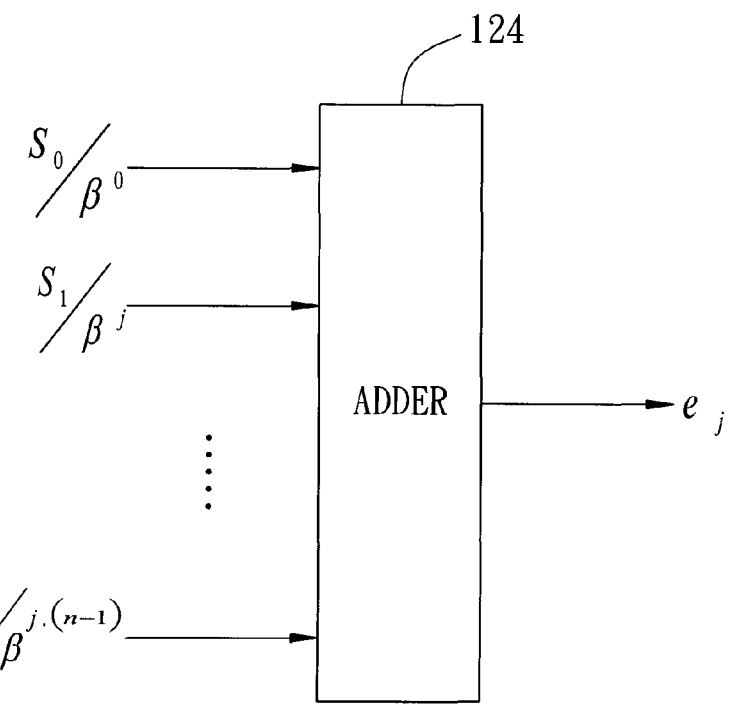

Referring to FIGS. 1, 2A and 2B, in the first preferred embodiment of the error correction decoder 1, the first computing module 121 of the error correction value generator 12 includes a plurality of multipliers 123, and the second computing module 122 of the error correction value generator 12 includes an adder 124. Since the roots $\beta^i$ of the generator polynomial is a given constant, the first computing module 121 uses each of the multipliers 123 that corresponds to one of the syndromes $S_i$ associated with the respective index i to compute a product of $S_i$ and $1/\beta^{j\cdot i}$ to obtain a corresponding one of the product values $S_i/\beta^{j\cdot i}$. Then, the adder 124 of the second computing module 124 is operable to generate one of the error correction values $e_j$ that corresponds to the jth one of the unit positions of the received signal according to $$e_j = \sum_{i=0}^{n-1} \left(\frac{S_i}{\beta^{j\cdot i}}\right). \quad (2)$$

For each of the unit positions j, the error correction value generator 12 is operable to generate a corresponding one of the error correction values $e_j$.

Figure 3:
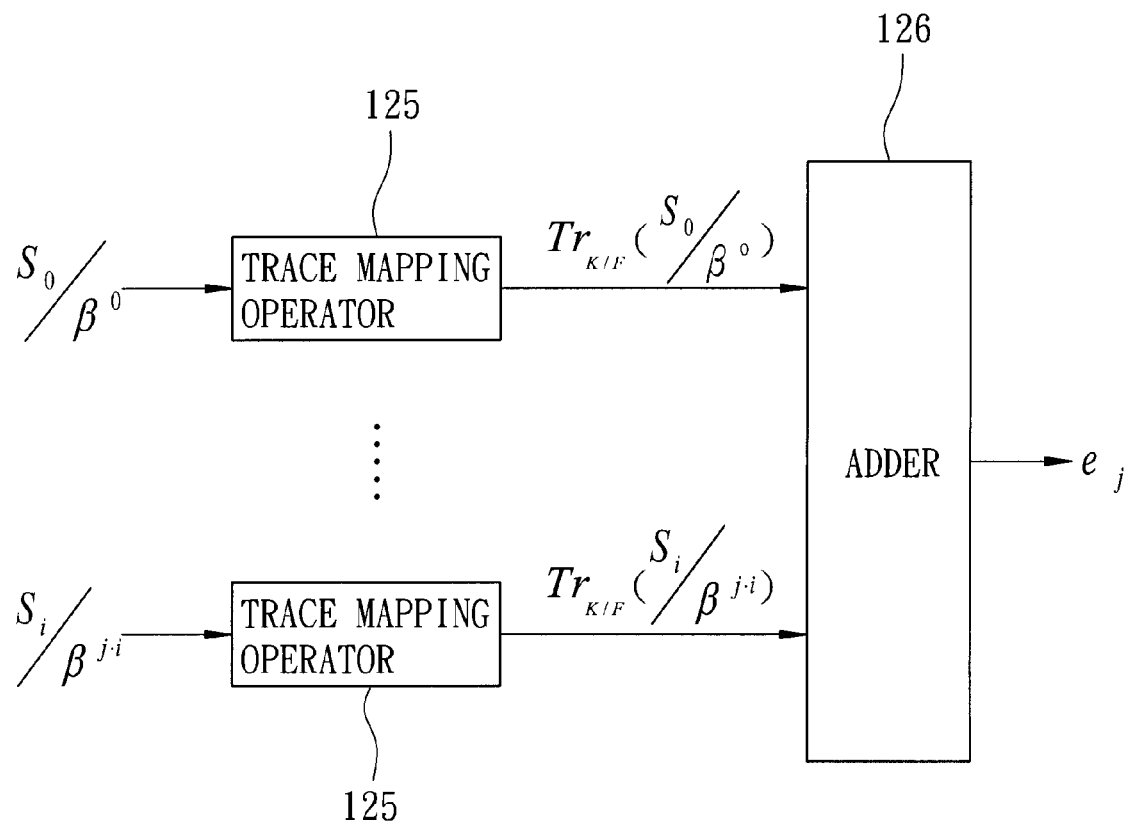
FIG. 3 is a schematic diagram illustrating a second preferred embodiment of the error correction value generator that includes a plurality of trace mapping operators and an adder.

Referring to FIGS. 1 and 3, in the second preferred embodiment, the syndrome generator 11 is operable to generate the syndromes $S_i$ that belong to a set of representative syndromes. The respective index i corresponding to each of the representative element belongs to a set R of all representatives of a cyclotomic coset $C_i$ of i modulo n, i.e., i∈R. Particularly, the cyclotomic coset $C_i$ is defined by the following Equation (3), $$C_i = \{i \cdot 2^k | k = 0, 1, \ldots, d-1\}, \quad (3)$$

where d is a minimum positive integer satisfying $i \cdot 2^d \equiv i \pmod{n}$. For facilitating the following description of the operation of the first and second computing modules 121 and 122, Equations (4) to (7) are proposed and explained herein.

$$F = GF(2) \quad (4)$$

$$E = GF(2^m) \quad (5)$$

$$K = GF(2^d) \quad (6)$$

In Equations (4) to (6), F is Galois Field GP(2), E is an extension field of Galois Field F=GF(2) of degree m, and K is a subfield of E. Moreover, trace mapping values from K onto F can be defined as $$Tr_{K/F}(\gamma) = \gamma + \gamma^2 + \ldots + \gamma^{2^{d-1}}, \gamma \in K. \quad (7)$$

In this embodiment, the first computing module 121 is similar to the first preferred embodiment. According to the above description, the first computing module 121 uses the multipliers 123 as shown in FIG. 2A to generate the product values $S_i/\beta^{j\cdot i}$, where i∈R. The second computing module 122 includes a plurality of trace mapping operators 125 and an adder 126 coupled to the trace mapping operators 125. The trace mapping operators 125 are operable to compute the trace mapping values $Tr_{K/F}(S_i/\beta^{j\cdot i})$ of the product values $S_i/\beta^{j\cdot i}$, respectively. In practice, each of the trace mapping operators 125 can be configured as an adder. Then, the adder 126 is operable to compute a summation of the trace mapping values $Tr_{K/F}(S_i/\beta^{j \cdot i})$ to obtain one of the error correction values $e_j$ according to $$e_j = \sum_{i \in R} Tr_{K/F}\left(\frac{S_i}{\beta^{j \cdot i}}\right). \quad (8)$$

Similarly, for each of the unit positions j, the error correction value generator 12 is operable to generate a corresponding one of the error correction values $e_j$.

Figure 4:
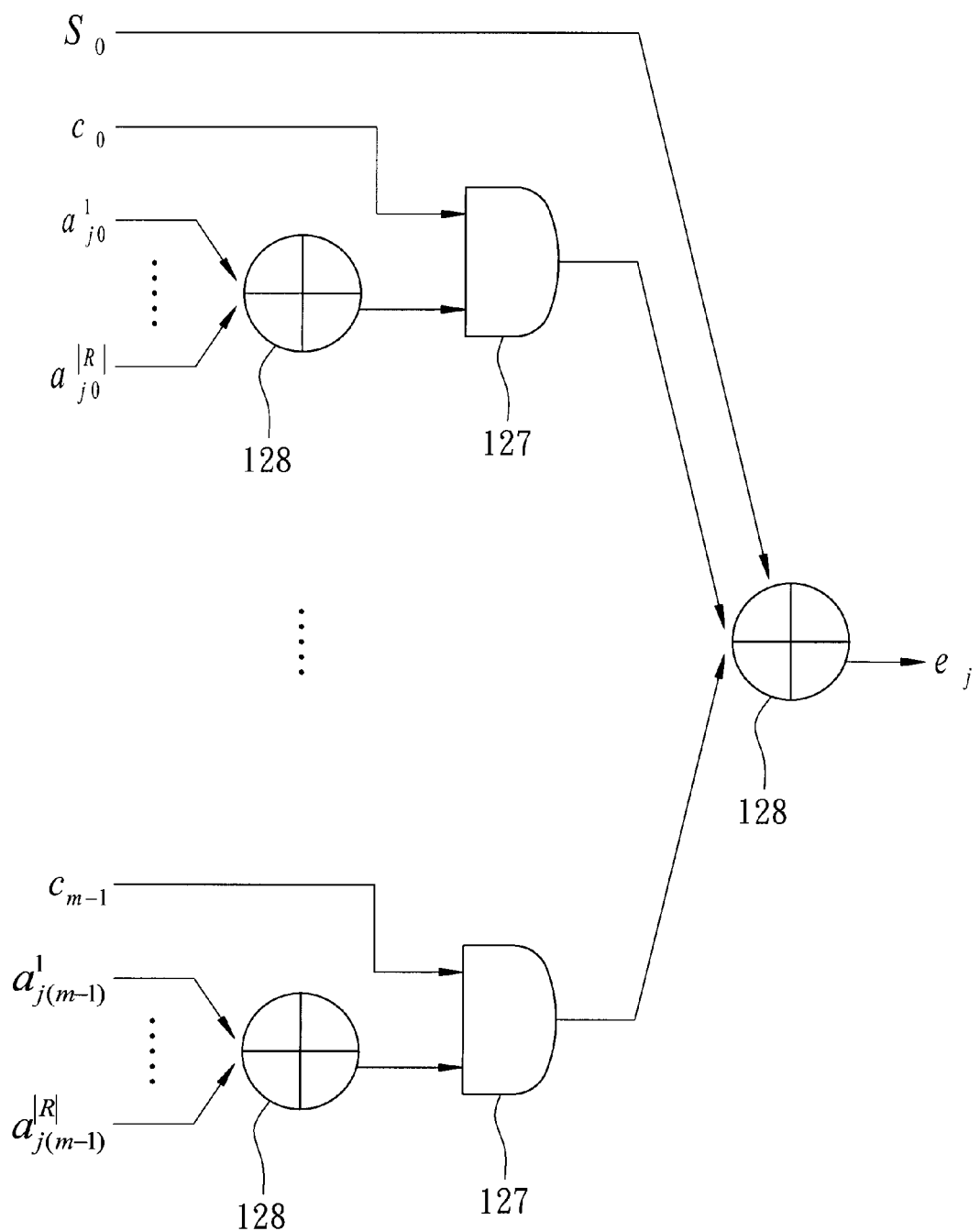
FIG. 4 is a schematic diagram illustrating a third preferred embodiment of the error correction value generator that includes a plurality of AND operators and a plurality of XOR operators.

Referring to FIGS. 1 and 4, in the third preferred embodiment, the syndrome generator 11 is similar to the second preferred embodiment, and is also operable to generate the syndromes $S_i$, where i∈R. The operation of the second computing module 122 of the error correction value generator 12 can be simplified according to the following assumption.

It is assumed that $(\alpha^0, \alpha^1, \ldots, \alpha^{m-1})$ form a basis set of $E=GF(2^m)$. Therefore, a set of trace mapping values can be defined as $$c_k = Tr_{E/F}(\alpha^k). \quad (9)$$

Since $\alpha^0$ to $\alpha^{m-1}$ are given constants, the set of trace mapping values $c_k$ can be predetermined and belong to Galois field F, i.e., $c_k \in F$. Further, if the roots $\beta^i$ of the generator polynomial belongs to E ($\beta \in E$), and the product values $S_i/\beta^{j \cdot i}$ can be expressed as $$\frac{S_i}{\beta^{j \cdot i}} = \sum_{k=0}^{m-1} a_{jk}^i \alpha^k, \quad (10)$$

where the coefficient sequence $a_{jk}^i$ belongs to F ($a_{jk}^i \in F$), the error correction value $e_j$ corresponding to the jth one of the unit positions of the received signal can be further simplified.

The first computing module 121 of the error correction value generator 12 is operable to generate the product values $S_i/\beta^{j \cdot i}$, where i∈R, and to store the coefficient sequence $a_{j0}^i$ to $a_{j(m-1)}^i$. Then, the second computing module 122 is configured to generate the error correction value $e_j$ according to $$e_j = S_0 + \sum_{k=0}^{m-1} \sum_{i=1}^{|R|} a_{jk}^i c_k. \quad (11)$$

In this embodiment, the second computing module 122 includes a plurality of AND operators 127 and a plurality of XOR operators 128 configured to compute the error correction value $e_j$. The AND operators 127 are operable to do multiplication operations of Equation (11), and the XOR operators 128 are operable to do addition operations of Equation (11).

Similarly, for each of the unit positions j, the error correction value generator 12 is operable to generate a corresponding one of the error correction values $e_j$.

Finally, according to the error correction values $e_j$ and the unit positions j of the received signal, the error correcting device 2 is operable to correct the errors of the received signal to output the corrected signal corresponding to the cyclic codeword of the source signal. When any of the error correction values $e_j$ is not equal to 0, this means that the received signal is corrupted and requires correction. Then, the error correcting device 2 is operable to generate the error polynomial $$e(x) = \sum_{j=0}^{n-1} e_j x^j$$

for correcting the errors of the received signal according to $$c(x)=r(x)-e(x). \quad (12)$$

To sum up, after obtaining the required syndromes, the first and second computing modules 121 and 122 of this invention are operable to generate the error correction values $e_j$ according to relatively easier operation and circuits without using Chien search and complex calculation for obtaining an error locator polynomial and an error magnitude polynomial. Therefore, the objects of the present invention can be certainly achieved.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An error correction decoder configured to be coupled to an error correcting device for providing the error correcting device with an error correction value to correct an error corresponding to an error position of a received signal received thereby, the received signal being generated based upon a generator polynomial, said error correction decoder comprising:
   a syndrome generator configured to receive the received signal, and generate a plurality of syndromes based upon the received signal, each of the syndromes being associated with a respective index; and
   an error correction value generator coupled to said syndrome generator and configured to receive the syndromes therefrom, said error correction value generator including
   a first computing module configured to generate a plurality of product values, each of which is generated for one of the syndromes based upon a respective power of roots of the generator polynomial, the respective power being determined based upon the respective index corresponding to one of the syndromes to be considered and unit positions of the received signal, and
   a second computing module coupled to said first computing module, said second computing module being configured to generate the error correction value according to the product values obtained by said first computing module, and to provide the error correcting device with the error correction value computed thereby for correcting the error of the received signal.

2. The error correction decoder as claimed in claim 1, wherein the syndromes generated by said syndrome generator include at least one known syndrome and at least one unknown syndrome, and said syndrome generator is configured to generate the known syndrome based upon a polynomial associated with the received signal and to generate the unknown syndrome according to the known syndrome.

3. The error correction decoder as claimed in claim 1, wherein said first computing module is configured to divide each of the syndromes by the respective power of the roots of the generator polynomial to obtain the product values.

4. The error correction decoder as claimed in claim 1, wherein, for each of the syndromes, the product value generated by said first computing module of said error correction value generator is equal to $S_i/\beta^{j \cdot i}$, where $S_i$ is one of the syndromes associated with the respective index i, j denotes the unit position of the received signal, and $\beta^i$ are the roots of the generator polynomial.

5. The error correction decoder as claimed in claim 4, wherein said first computing module of said error correction value generator includes a multiplier configured to compute a product of $S_i$ and $1/\beta^{j \cdot i}$ to obtain a corresponding one of the product values $S_i/\beta^{j \cdot i}$.

6. The error correction decoder as claimed in claim 4, a source signal being encoded based upon the generator polynomial to generate a cyclic codeword with a length n, the cyclic codeword being transmitted to said error correction decoder via a transmission channel to result in the received signal, wherein the error correction value is generated by said second computing module of said error correction value generator according to $$e_j = \sum_{i=0}^{n-1} \left( \frac{S_i}{\beta^{j \cdot i}} \right),$$

where $e_j$ is the error correction value.

7. The error correction decoder as claimed in claim 4, a source signal being encoded based upon the generator polynomial to generate a cyclic codeword with a length n, the cyclic codeword being transmitted to said error correction decoder via a transmission channel to result in the received signal, wherein the syndromes generated by said syndrome generator belong to a set of representative syndromes, and the respective index corresponding to each of the syndromes belongs to a set of all representatives of a cyclotomic coset of i modulo n.

8. The error correction decoder as claimed in claim 7, wherein said second computing module of said error correction value generator is configured to compute a plurality of trace mapping values $Tr_{K/F}(S_i/\beta^{j \cdot i})$, each of which corresponds to one of the product values, and to compute a summation of the trace mapping values to obtain the error correction value according to $$e_j = \sum_{i \in R} Tr_{K/F}\left( \frac{S_i}{\beta^{j \cdot i}} \right),$$

where $e_j$ is the error correction value, R is the set of all representatives of the cyclotomic coset of i modulo n, F is Galois field GF(2), K is Galois field GF($2^d$), and d is a minimum positive integer satisfying $i \cdot 2d \equiv i \pmod{n}$.

9. The error correction decoder as claimed in claim 7, the roots of the generator polynomial belonging to E=GF($2^m$) being an extension field of Galois field F=GF(2) of degree m, wherein:

said first computing module further generates a coefficient sequence $a_{j0}{}^i$ to $a_{j(m-1)}{}^i$ according to $$\frac{S_i}{\beta^{j \cdot i}} = \sum_{k=0}^{m-1} a_{jk}^i \alpha^k,$$

where $a_{j0}{}^i$ to $a_{(m-1)}{}^i$ belong to Galois field F, and $(\alpha^0, \alpha^1, \ldots, \alpha^{m-1})$ form a basis set of E; and the error correction value is generated by said second computing module of said error correction value generator according to $$e_j = S_0 + \sum_{k=0}^{m-1} \sum_{i=1}^{|R|} a_{jk}^i c_k,$$

where $e_j$ is the error correction value, and $c_0$ to $c_{m-1}$ are predetermined according to the basis set of E and belong to Galois field F.

10. The error correction decoder as claimed in claim 9, wherein said second computing module includes a plurality of AND operators and a plurality of XOR operators configured to compute the error correction value.

11. An error correction value generator configured for use in an error correction decoder that is coupled to an error correcting device for providing the error correcting device with an error correction value to correct an error corresponding to an error position of a received signal received by the error correction decoder, and that includes a syndrome generator configured to generate a plurality of syndromes based upon the received signal, each of the syndromes being associated with a respective index, the received signal being generated based upon a generator polynomial, said error correction value generator being configured to be coupled to the syndrome generator for receiving the syndromes therefrom, and comprising:

a first computing module configured to generate a plurality of product values, each of which is generated for one of the syndromes based upon a respective power of roots of the generator polynomial, the respective power being determined based upon the respective index corresponding to one of the syndromes to be considered and unit positions of the received signal; and a second computing module coupled to said first computing module, said second computing module being configured to generate the error correction value according to the product values obtained by said first computing module, and to provide the error correcting device with the error correction value computed thereby for correcting the error of the received signal.

12. The error correction value generator as claimed in claim 11, wherein said first computing module is configured to divide each of the syndromes by the respective power of the roots of the generator polynomial to obtain the product values.

13. The error correction value generator as claimed in claim 11, wherein, for each of the syndromes, the product value generated by said first computing module is equal to $S_i/\beta^{j \cdot i}$, where $S_i$ is one of the syndromes associated with the respective index i, j is the unit position of the received signal, and $\beta^i$ are the roots of the generator polynomial.

14. The error correction value generator as claimed in claim 13, wherein said first computing module includes a multiplier configured to compute a product of $S_i$ and $1/\beta^{j \cdot i}$ to obtain a corresponding one of the product values $S_i/\beta^{j \cdot i}$.

15. The error correction value generator as claimed in claim 13, a source signal being encoded based upon the generator polynomial to generate a cyclic codeword with a length n, the cyclic codeword being transmitted to the error correction decoder via a transmission channel to result in the received signal, wherein the error correction value is generated by said second computing module according to $$e_j = \sum_{i=0}^{n-1} \left(\frac{S_i}{\beta^{j \cdot i}}\right),$$

where $e_j$ is the error correction value.

16. The error correction value generator as claimed in claim 13, a source signal being encoded based upon the generator polynomial to generate a cyclic codeword with a length n, the cyclic codeword being transmitted to the error correction decoder via a transmission channel to result in the received signal, wherein said first computing module generates the product values for each of the syndromes belonging to a set of representative syndromes, and the respective index corresponding to each of the syndromes belongs to a set of all representatives of a cyclotomic coset of i modulo n.

17. The error correction value generator as claimed in claim 16, wherein said second computing module is configured to compute a plurality of trace mapping values $Tr_{K/F}(S_i/\beta^{j \cdot i})$, each of which corresponds to one of the product values, and to compute a summation of the trace mapping values to obtain the error correction value according to $$e_j = \sum_{i \in R} Tr_{K/F}\left(\frac{S_i}{\beta^{j \cdot i}}\right),$$

where $e_j$ is the error correction value, R is the set of all representatives of the cyclotomic coset of i modulo n, F is Galois field GF(2), K is Galois field GF($2^d$), and d is a minimum positive integer satisfying $i \cdot 2^d \equiv i \pmod{n}$.

18. The error correction value generator as claimed in claim 16, the roots of generator polynomial belonging to E=GF($2^m$) being an extension field of Galois field F=GF(2) of degree m, wherein:

said first computing module further generates a coefficient sequence $a_{j0}^i$, to $a_{j(m-1)}^i$ according to $$\frac{S_i}{\beta^{j \cdot i}} = \sum_{k=0}^{m-1} a_{jk}^i \alpha^k,$$

where $a_{j0}^i$ to $a_{j(m-1)}^i$ belong to Galois field F, and ($\alpha^0$, $\alpha^1$, ..., $\alpha^{m-1}$) form a basis set of E; and the error correction value is generated by said second computing module according to $$e_j = S_0 + \sum_{k=0}^{m-1} \sum_{i=1}^{|R|} a_{jk}^i c_k,$$

where $e_j$ is the error correction value, and $c_0$ to $c_{m-1}$ are predetermined according to the basis set of E and belong to Galois field F.

19. The error correction value generator as claimed in claim 18, wherein said second computing module includes a plurality of AND operators and a plurality of XOR operators configured to compute the error correction value.

20. An error correction system configured for correcting an error corresponding to an error position of a received signal received thereby, the received signal being generated based upon a generator polynomial, said error correction system comprising:

an error correction decoder including
  a syndrome generator configured to receive the received signal, and generate a plurality of syndromes based upon the received signal, each of the syndromes being associated with a respective index, and
  an error correction value generator coupled to said syndrome generator and being configured to generate a plurality of error correction values according to the syndromes received from said syndrome generator; and an error correcting device coupled to said error correction value generator and configured to receive the error correction values therefrom, said error correcting device being configured to correct the error of the received signal according to the error correction values;

wherein said error correction value generator of said error correction decoder includes
  a first computing module being configured to generate a group of product values for each of unit positions of the received signal, each of the product values of the same group being generated based upon one of the syndromes and a respective power of roots of the generator polynomial, the respective power being determined based upon the respective index corresponding to one of the syndromes to be considered and the corresponding one of the unit positions, and
  a second computing module coupled to said first computing module, and being configured to generate the error correction values according to the groups of the product values, respectively.

21. The error correction system as claimed in claim 20, wherein said error correcting device is configured to generate an error polynomial according to the error correction values that serve as coefficients of the error polynomial, and to correct the error of the received signal according to the error polynomial.

22. The error correction system as claimed in claim 20, wherein the syndromes generated by said syndrome generator include at least one known syndrome and at least one unknown syndrome, and said syndrome generator is configured to generate the known syndrome based upon a polynomial associated with the received signal and to generate the unknown syndrome according to the known syndrome.

23. The error correction system as claimed in claim 20, wherein said first computing module is configured to divide each of the syndromes by the respective power of the roots of the generator polynomial to obtain the product values.

24. The error correction system as claimed in claim 20, wherein, for each of the syndromes, the product value generated by said first computing module of said error correction value generator is equal to $S_i/\beta^{j \cdot i}$, where $S_i$ is one of the syndromes associated with the respective index i, j is the unit position of the received signal, and $\beta^i$ are the roots of the generator polynomial.

* * * * *